United States Patent
Bales et al.

(10) Patent No.: US 9,697,313 B2
(45) Date of Patent: Jul. 4, 2017

(54) ORGANIZATION FOR VIRTUAL-FLAT EXPANSION OF PHYSICAL DATA IN PHYSICALLY-HIERARCHICAL IC DESIGNS

(71) Applicant: Synopsys, Inc., Mountain View, CA (US)

(72) Inventors: Mark William Bales, Mountain View, CA (US); Jeffrey Jude Loescher, Mountain View, CA (US); Paul Furnanz, Mountain View, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/860,652

(22) Filed: Sep. 21, 2015

(65) Prior Publication Data

US 2016/0085886 A1    Mar. 24, 2016

Related U.S. Application Data

(60) Provisional application No. 62/052,977, filed on Sep. 19, 2014.

(51) Int. Cl.
*G06F 17/50* (2006.01)

(52) U.S. Cl.
CPC ........ *G06F 17/505* (2013.01); *G06F 17/5072* (2013.01)

(58) Field of Classification Search
CPC ............. H01L 27/0207; H01L 27/0922; G06F 17/5072; G06F 17/5081; G06F 17/5068; G06F 17/505; G06F 17/5077; G06F 17/5009; G06F 17/5045; G06F 17/5022; G06F 2217/12; G06F 2217/08; G06F 12/00; G06F 12/0207; G06F 12/0653; G06F 12/1027
USPC ................................................ 716/100–108
See application file for complete search history.

(56) References Cited

U.S. PATENT DOCUMENTS

| | | | | |
|---|---|---|---|---|
| 2006/0036977 | A1* | 2/2006 | Cohn | G06F 17/5072 716/51 |
| 2008/0016483 | A1* | 1/2008 | Chan | G06F 17/5068 716/122 |
| 2012/0233575 | A1* | 9/2012 | Kashyap | G06F 17/5068 716/55 |

* cited by examiner

*Primary Examiner* — Binh Tat
(74) *Attorney, Agent, or Firm* — Alston & Bird LLP

(57) ABSTRACT

In Integrated Circuit (IC) Physical Design, the shapes and other geometric objects that are used to represent the mask data have physical coordinates expressed in a Cartesian plane. When the designs are hierarchical, each level of physical hierarchy has its own coordinate system. When viewed from the top level of a hierarchical design, lower-level shapes must be transformed in order to understand their location from the point of view of the top block. Users and algorithms that manipulate physical data across these hierarchy boundaries must go through the tedious task of transforming data, sometimes multiple times, as it is being changed.

14 Claims, 12 Drawing Sheets

ORGANIZATION FOR VIRTUAL-FLAT EXPANSION OF PHYSICAL DATA IN PHYSICALLY-HIERARCHICAL IC DESIGNS

CROSS REFERENCE TO RELATED APPLICATIONS

This application is claims the benefit of priority under 35 U.S.C. 119(e) to U.S. Provisional Application 62/052,977, entitled "AN ORGANIZATION FOR VIRTUAL-FLAT EXPANSION OF PHYSICAL DATA IN PHYSICALLY-HIERARCHICAL IC DESIGNS", filed Sep. 19, 2014, the content of which is incorporated herein by reference in its entirety.

BACKGROUND OF THE INVENTION

Field of the Invention

The present disclosure relates to electronic-design-automation (EDA) techniques. More specifically, the present disclosure relates to a technique for interacting with an integrated circuit in a hierarchical design.

Related Art

As semiconductor technology is scaled to ever smaller dimensions, there are commensurate increases in the complexity of digital circuit designs. For example, smaller dimensions typically result in digital circuit designs having an increased number of logic gates and time domains. Moreover, this increase in complexity typically results in a significant increase in the time and cost needed to design and implement digital circuits.

In Integrated Circuit (IC) Physical Design, the shapes and other geometric objects that are used to represent the mask data have physical coordinates expressed in a Cartesian plane. When the designs are hierarchical, each level of physical hierarchy has its own coordinate system. When viewed from the top level of a hierarchical design, lower-level shapes must be transformed in order to understand their location from the point of view of the top block. Users and algorithms that manipulate physical data across these hierarchy boundaries must go through the tedious task of transforming data, sometimes multiple times, as it is being changed.

Accordingly, what is desired are improved methods and apparatus for solving some of the problems discussed above. Additionally, what is desired are improved methods and apparatus for reducing some of the drawbacks discussed above.

BRIEF SUMMARY OF THE INVENTION

The following portion of this disclosure presents a simplified summary of one or more innovations, embodiments, and/or examples found within this disclosure for at least the purpose of providing a basic understanding of the subject matter. This summary does not attempt to provide an extensive overview of any particular embodiment or example. Additionally, this summary is not intended to identify key/critical elements of an embodiment or example or to delineate the scope of the subject matter of this disclosure. Accordingly, one purpose of this summary may be to present some innovations, embodiments, and/or examples found within this disclosure in a simplified form as a prelude to a more detailed description presented later.

In various embodiments, systems and methods are provided allowing a user to interact with all of the physical data of an integrated circuit as if it was in a single flat design with a single consistent coordinate system. In one aspect, it is a physically hierarchical design with multiple scopes for objects and multiple coordinate systems without incurring the overhead of a flat design.

In various embodiments, systems and methods are provided for creating handles to physical shapes that are rooted at the top (or a higher) level of a physically hierarchical IC design. These handles take care of the transformations for the physical shapes, and allow the use and editing of these shapes using the top-level coordinate system with no additional work on the part of the user. In certain embodiments, a method is provide for caching instance transforms on an unfolded logical data for the design to improve greatly the performance of the transforms. Together, these enable Transparent Hierarchy Editing that lets the user edit shapes within differing levels of physical hierarchy as though the design hierarchy had been completely flattened.

In certain embodiments, systems and methods are provided allowing for objects from separate contexts (physical designs) to be simultaneously selected and manipulated in a manner consistent with a single coordinate system.

In certain embodiments, a set of transformations on instances is maintained in a cache in the face of change of location and/or orientation of one or more instances in a physical hierarchy. This mechanism works in multi-level (three or more) physical hierarchies. "Leaf-cell" data (which can be folded) is treated differently than intermediate levels of logic hierarchy (which may not exist in the HierBlock Aspect). HierBlock Object Handles can be created to be persistent or non-persistent.

A further understanding of the nature of and equivalents to the subject matter of this disclosure (as well as any inherent or express advantages and improvements provided) should be realized in addition to the above section by reference to the remaining portions of this disclosure, any accompanying drawings, and the claims.

BRIEF DESCRIPTION OF THE DRAWINGS

In order to reasonably describe and illustrate those innovations, embodiments, and/or examples found within this disclosure, reference may be made to one or more accompanying drawings. The additional details or examples used to describe the one or more accompanying drawings should not be considered as limitations to the scope of any of the claimed inventions, any of the presently described embodiments and/or examples, or the presently understood best mode of any innovations presented within this disclosure.

DETAILED DESCRIPTION OF THE INVENTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a computer system, a method, a graphical user interface and a computer-program product (i.e., software and/or a layout editor) for use with the computer system are described. A circuit designer may use these systems, devices, and/or techniques to configure and monitor the execution of tasks in a user-configurable electronic-design-automation (EDA) flow associated with a circuit or circuit design. In particular, using an intuitive and interactive graphical user interface in EDA software (e.g. a layout editor), the circuit designer can configure and initiate execution of the EDA flow. Then, during execution of EDA tasks in the EDA flow, an execution monitor in the graphical user interface may provide a graphical representation of real-time execution status information for the EDA tasks. Moreover, using the EDA software, the circuit designer can debug the circuit design if any errors or problems occur.

By providing real-time feedback on progress and any problems, these devices and techniques can improve: project visibility, productivity and/or predictability. For example, using these devices and techniques, chip designers can design circuits or chips that are manufacturing ready in a single-pass design cycle. Consequently, these devices and techniques may make it easier for chip designers to design circuits or chips, which can decrease the time and cost of circuit or chip design, thereby increasing customer satisfaction and retention.

Figure 1:
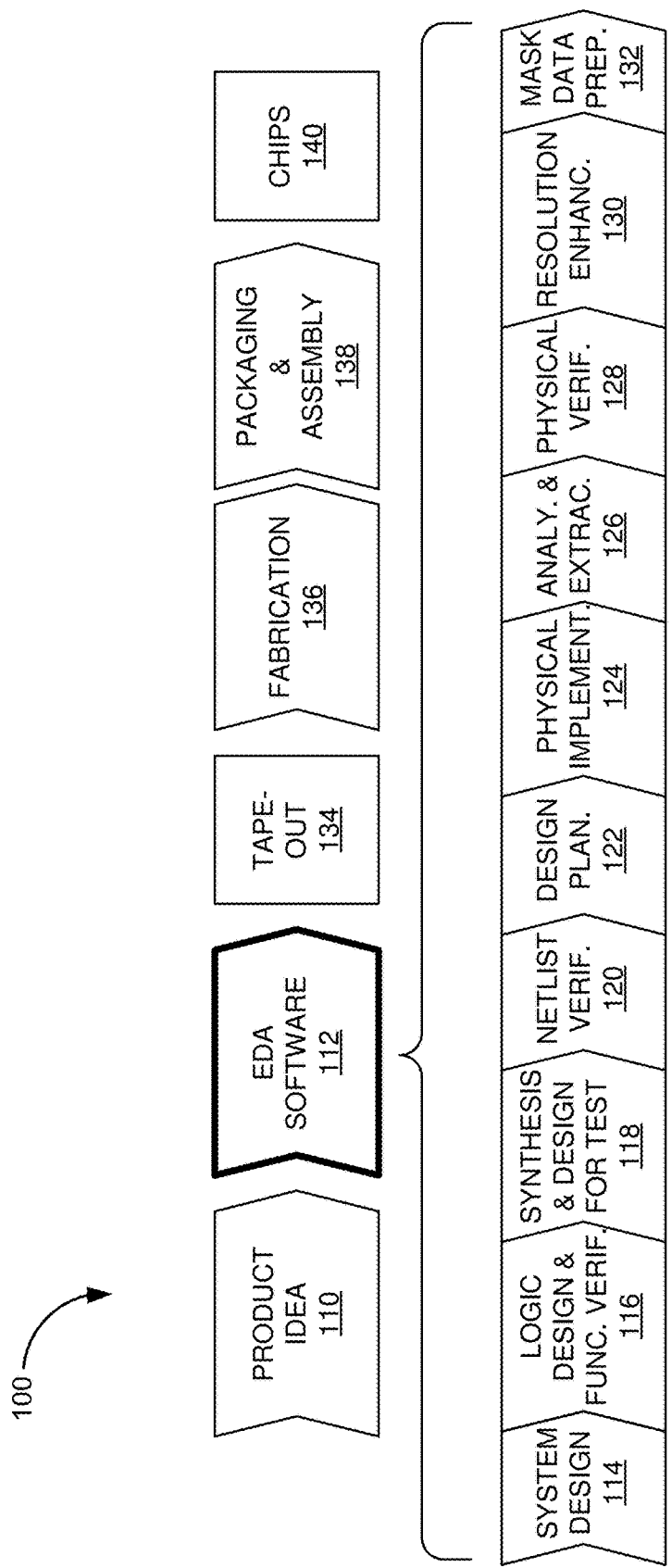
FIG. 1 is a flowchart illustrating various operations in the design and fabrication of an integrated circuit in accordance with an embodiment of the present disclosure.

Embodiments of design and fabrication of integrated circuits or chips are now described with reference to FIG. 1. FIG. 1 is flowchart 100 illustrating the various operations in the design and fabrication of an integrated circuit. This process starts with the generation of a product idea (110), which is realized during a design process that uses electronic design automation (EDA) software (112). When the design is finalized, it can be taped-out (134). After tape-out, a semiconductor die is fabricated (136) and packaging and assembly processes (138) are performed, which ultimately result in finished chips (140).

Note that the design process that uses EDA software (112) includes operations 114-132, which are described below.

This design flow description is for illustration purposes only. In particular, this description is not meant to limit the present disclosure. For example, an actual integrated circuit design may require a designer to perform the design operations in a different sequence than the sequence described herein.

During system design (114), designers describe the functionality to implement. They can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect®, Saber, System Studio®, and Designware® products.

Then, during logic design and functional verification (116), VHDL or Verilog code for modules in the circuit is written and the design is checked for functional accuracy. More specifically, the design is checked to ensure that it produces the correct outputs. Exemplary EDA software products from Synopsys, Inc. of Mountain View, Calif. that can be used at this stage include: VCS®, Vera®, Designware®, Magellan®, Formality®, ESP® and Leda® products.

Next, during synthesis and design for test (118), VHDL/Verilog is translated to a netlist. This netlist can be optimized for the target technology. Additionally, tests can be designed and implemented to check the finished chips. Exemplary EDA software products from Synopsys, Inc. of Mountain View, Calif. that can be used at this stage include: Design Compiler®, Physical Compiler®, Design Compiler II®, Test Compiler®, Power Compiler®, FPGA Compiler®, Tetramax®, and Designware® products.

Moreover, during netlist verification (120), the netlist is checked for compliance with timing constraints and for correspondence with the VHDL/Verilog source code. Exemplary EDA software products from Synopsys, Inc. of Mountain View, Calif. that can be used at this stage include: Formality®, Primetime®, and VCS® products.

Furthermore, during design planning (122), an overall floor plan for the chip is constructed and analyzed for timing and top-level routing. Exemplary EDA software products from Synopsys, Inc. of Mountain View, Calif. that can be used at this stage include: Astro® IC Compiler® and IC Compiler II Design Planner® products.

Additionally, during physical implementation (124), the placement (positioning of circuit elements) and routing (connection of the same) occurs. Exemplary EDA software products from Synopsys, Inc. of Mountain View, Calif. that can be used at this stage include: the Astro® and IC Compiler® products.

Then, during analysis and extraction (126), the circuit function is verified at a transistor level, which permits refinement. Exemplary EDA software products from Synopsys, Inc. of Mountain View, Calif. that can be used at this stage include: Astrorail®, Primerail®, Primetime®, and Star RC/XT® products.

Next, during physical verification (128), the design is checked to ensure correctness for: manufacturing, electrical issues, lithographic issues, and circuitry. Exemplary EDA software products from Synopsys, Inc. of Mountain View, Calif. that can be used at this stage include the Hercules® and IC Validator® products.

Moreover, during resolution enhancement (130), geometric manipulations of the layout are performed to improve manufacturability of the design. Exemplary EDA software products from Synopsys, Inc. of Mountain View, Calif. that can be used at this stage include: Proteus®, Proteus®AF, and PSMGED® products.

Additionally, during mask-data preparation (132), the 'tape-out' data for production of masks to produce finished chips is provided. Exemplary EDA software products from Synopsys, Inc. of Mountain View, Calif. that can be used at this stage include the CATS® family of products.

Embodiments of the present disclosure can be used during one or more of the above-described stages. Specifically, in some embodiments the present disclosure can be used in EDA software that includes operations between design (114) and resolution enhancement (130).

We now describe embodiments of a technique for design portion of the EDA flow. EDA software may provide interactive flow-control environment that includes EDA tools, utilities and automation which allow a user (such as a chip designer) to design a circuit or a chip, including: layout, node optimization, and EDA flows that include multiple EDA tasks or tool scripts. These EDA flows may include block-level flows and full-chip hierarchical flows, which act on a circuit or chip design (which is henceforth referred to as a circuit design).

To accelerate circuit development using the EDA software, the user may use a variety of preconfigured or predefined content, including EDA tool scripts with default technology settings and/or default flows associated with blocks in the circuit design. However, the EDA software also supports user-defined technology settings and block configurations (i.e., the EDA software is programmable).

In general, a particular design may be specified by a corresponding user-configurable EDA flow, which includes a sequence of blocks having associated block flows and sub-block or step flows. A given block in the sequence of blocks may include one or more sub-block flows, and a given sub-block in the sub-block flow may represent a sequence of EDA tasks that are performed on a circuit design.

In the discussion that follows, an EDA task is defined as an EDA tool script that performs a single or small number of related commands on a circuit design. For example, the EDA tasks may include: an elaborate script, a synthesis script, a clock route script, a design-implementation script, a design-optimization script, a design-analysis script, etc. In contrast with operating-system processes, these commands operate on a circuit design. Note that each EDA task may involve multiple operating-system processes.

Moreover, a step flow (or a sub-block flow) is defined as a collection or sequence of inter-coupled EDA tasks that operate on the circuit design. In general, step flows are grouped into functional areas such as: synthesis, floor planning, place and route, chip finishing, etc. Note that a step flow is always 'flat.'

Additionally, a block flow is defined as a collection or sequence of inter-coupled step flows that complete at least a portion of the circuit design. Note that block flows can be hierarchical flows (e.g., flows that have a treed structure with a root level and one or more dependent branches). Furthermore, many circuit designs are specified as a sequence of inter-coupled blocks (and their associated flows).

The EDA software can include foundry-ready technology, designs and libraries, such as EDA tool scripts and flow templates that are preconfigured based at least in part on the requirements associated with particular semiconductor manufacturers or manufacturing facilities, and which are already validated. In addition, the EDA software may provide preconfigured foundry-specific checklists and documentation to assist the user in prompt and successful tape-out of the circuit design.

In order to improve product visibility (and, thus, user productivity), the EDA software may also support the generation of on-demand management reports, including real-time queries during the execution of a user-configurable EDA flow. These reports may be user configured, and may allow the user to monitor performance metrics, such as: area utilization, clock speed, timing analysis, power consumption, and/or any errors that occur during execution of the user-configurable EDA flow.

While assessing the sub-circuit via computer modeling of its functionality, various problems may be identified. Some of these problems may only come to the fore as aspects of the physical implementation are brought into the modeling context. Resolution of these problems may require the designer to re-work or refine a sub-module of the sub-circuit. Furthermore, such refinement may require multiple iterations of the sub-module in evaluation of the changes before the optimal solution is identified. Accordingly, the time associated with each iteration is of significance.

Design System

Data in a design system is delineated into three existing aspects that are self-contained and represent different ways of looking at the design data. First, a Module Aspect represents the original netlist as read in from Verilog or some other netlist source. In this aspect, the logical data is folded, which means that all instances of a given reference point to the same single definition for that reference. Built upon this aspect is a Hier Aspect, which represents the unfolded logical netlist. In contrast to the Module Aspect, in the Hier Aspect all instances of a given reference point to an independent, distinct reference. Built upon the Hier Aspect is a Block Aspect, which is a folded physical aspect. In this aspect, intermediate levels of logic hierarchy that are not physical do not appear, making each level of physical hierarchy appear to have been flattened from the Hier Aspect. Although each of these aspects appears independent and complete, in some embodiments they are strongly interrelated and rely on each other to reduce overall memory used and to increase performance, especially in the face of modifications.

In the Hier Aspect, each instance has a reference called a Hier, which is the expanded version of the reference Module. Each design, whether it is physically hierarchical or physically flat, has a HierRoot, which represents the highest physical level Hier object in the design. There can be many other Hier objects representing intermediate levels of logic hierarchy. In a physically hierarchical design, the top-most Hier in any level of physical hierarchy is called a RootHier.

Figure 2:
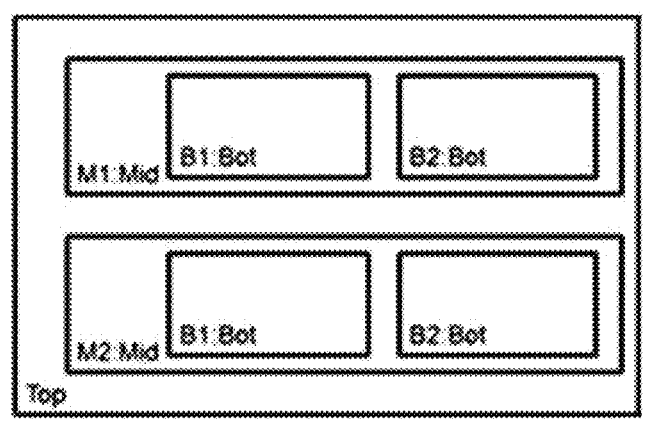
FIG. 2 refers to a 3-level physical hierarchy example with block Top that contains two instances M1 and M2 of block Mid in one embodiment.

FIG. 2 refers to a 3-level physical hierarchy example with block Top that contains two instances M1 and M2 of block Mid in one embodiment. The Mid block contains two instances B1 and B2 of block Bot. As can be seen in the figure, in the Hier Aspect there are two Hiers of Mid (M1 & M2) and four Hiers of Bot (M1/B1, M1/B2, M2/B1 and M2/B2). The Hiers at the top of the unfolded Top, Mid, and Bot are all RootHiers. The RootHier Top is also a HierRoot.

Figure 3:
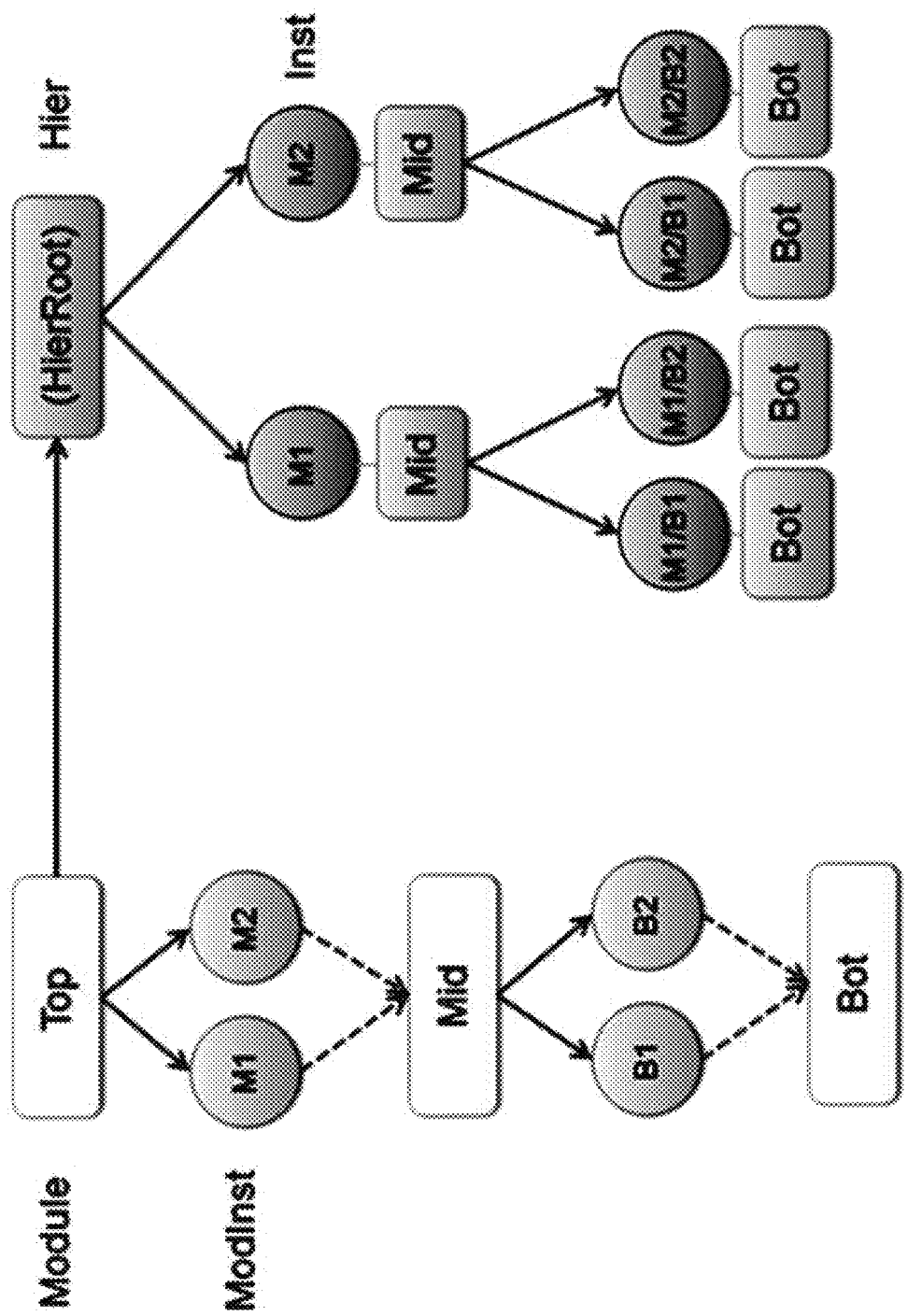
FIG. 3 depicts the 3-level physical hierarchy of FIG. 2 as a tree expansion in one embodiment.

FIG. 3 depicts the 3-level physical hierarchy of FIG. 2 as a tree expansion. FIG. 3 shows the relationship between the Module Aspect, which is depicted on the left side, and the Hier Aspect, which is depicted on the right side. Each Module of the Module Aspect corresponds to one or more Hier objects of the Hier Aspect and each ModInst of the Module Aspect corresponds to one or more Instance (Inst) objects of the Hier Aspect. Taken from the Module Aspect, Top block contains two instances of Mid block M1 and M2 that both refer back to the Mid block (i.e. logically folded). In contrast, taken from the Hier Aspect, Top block contains two instances of Mid block M1 and M2 that refer back to two separate instances of the Mid block (i.e. unfolded). The same differences can be seen with respect to the Bot block.

The Hierblock Aspect

Figure 4:
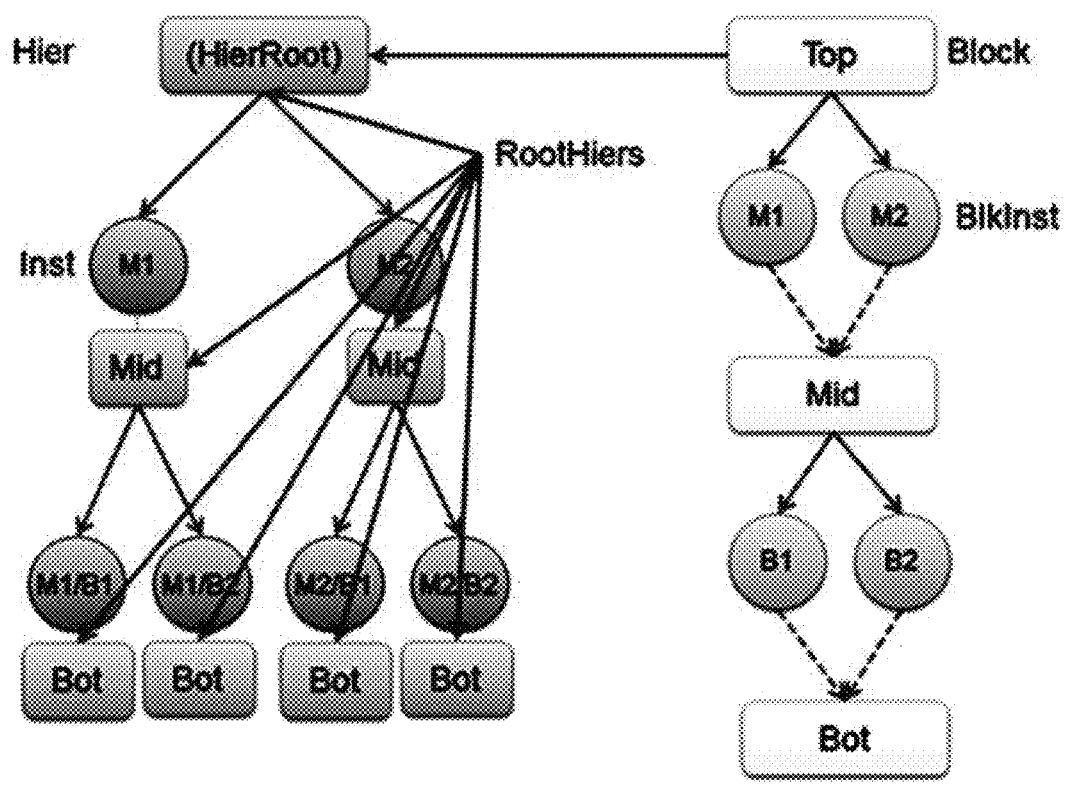
FIG. 4 represents the relationship between the Hier (logical unfolded) and Block (physical folded) aspects in one embodiment.

FIG. 4 depicts the 3-level physical hierarchy of FIG. 2 as a tree expansion. FIG. 4 shows the relation between Hier Aspect (logical unfolded), which is depicted on the left side and Block Aspect (physical folded), which is depicted on the right side. Each Block of the Block Aspect corresponds to one or more Hier objects of the Hier Aspect and each Block Instance (BlkInst) corresponds to one ore more Inst objects of the Hier Aspect. Taken from the Block Aspect, Top block contains two instances of Mid block M1 and M2 that both refer back to the Mid block (i.e. physically folded). In contrast, taken from the Hier Aspect, Top block contains two instances of Mid block M1 and M2 that refer back to two separate instances of the Mid block (i.e. unfolded). The same differences can be seen with respect to the Bot block.

As detailed herein, a new aspect is introduced called the HierBlock (physical unfolded) aspect. Unlike the other aspects, this aspect is virtually unfolded. In other words, there are no persistent objects that represent the unfolded block objects. Rather, HierBlock handles are used as non-persistent IDs to create handles that behave as though they were in fact unfolded block objects.

Transform Caching and Usage

In integrated circuit physical design using EDA, each level of physical hierarchy has its own coordinate system based on the Cartesian plane. The plane is labeled with X- and Y-axes, and an (X, Y) coordinate pair specifies a unique point in the plane.

As multiple levels of a physical hierarchy are created, a Block Instance (BlkInst) of a reference physical Block (e.g. a copy of a physical layer) is placed at a point in the parent coordinate system, and has an orientation (rotation) that can be applied to it as well. There is a need to transform coordinates from lower-level blocks into the coordinate system of the higher-level blocks. By doing this, every object's location may be determined in relation to the highest-level block. Thus providing the user of the EDA, an interface to an every object such that the layout appears only from the prospective of the highest-level block (i.e. appears physically flat).

When there are multiple levels of physical hierarchy, transforms of lower-level physical data can be concatenated with transforms for incrementally higher-level physical until the top-level physical layer is reached. For example, in FIG. 2, the transforms for the instances of Mid (M1 (Mid) and M2 (Mid)) can be concatenated with the transforms for the instances of Bot in order to construct a transform that can be used to translate physical coordinates in the coordinate system for Bot into the coordinate system for Top.

Typically, the transforms needed to transform lower-level physical data are needed frequently and require recalculation which is computationally expensive. For example, with reference to FIGS. 2 & 3 the following steps would be taken: (1) physical data located in M2/B1 would be initially identified with the coordinate system of B1 (Bot), because M2/B1 lies in the instance B1 of the physical layer Bot; (2) the coordinate system of instance B1 would be transformed to the coordinate system of M2 (Mid), because Bot lies in the instance M2 of the physical layer Mid; (3) the coordinate system of M2 (Mid) would be transformed to the coordinate system of Top, because instance M2 of physical layer Mid lies in the physical layer of Top.

In an example using the above mentioned steps with reference to FIG. 2 the following process would be used to traditionally transform the coordinates of a physical shape located in M2/B1 into the coordinates system of Top. (1) Assume the origin (i.e. the lower left corner) of a physical shape in M2/B1 is {100, 100} according to the coordinate system of Bot because M2/B1 lies in an the instance B1 of the physical layer Bot. (2) The origin of B1 is {100, 100} according to the coordinate system of M2 (Mid), because Bot lies in the instance of M2 of the physical layer Mid, so {100, 100}+{100, 100}={200, 200} will give the origin of the physical shape with respect to M2 (Mid). This means the transform to convert coordinates from M2/B1 to M2 is +{100, 100}. (3) The origin of M2 (Mid) is {100, 100} according to the coordinate system of Top, because M2 (Mid) lies in physical layer Top, so {200, 200}+{100, 100}={300, 300} will give the origin of the physical shape with respect to Top. This means the transform to convert coordinates from B1 to Top is +{200, 200}. This calculation is done every single time a physical object in M2/B1 is accessed.

To avoid the cost of recalculation a memory cache is introduced. The concatenated transforms for each RootHier that transform the coordinate system of the RootHier to the coordinate system of the HierRoot in one transformation are calculated and cached. For example, with reference to in FIGS. 2 & 3 the following steps would be taken: (1) calculate a transform to convert coordinates in Bot to coordinates in Top and store in a cache; (2) physical data located in M2/B1 would be initially identified with the coordinate system of Bot, because M2/B1 lies in the instance B1 of physical layer Bot. (3) Apply the transform from step 1 to the coordinates identified in step 2. By caching the transform from a RootHier to the HierRoot recomputation the costs are saved, because step 1 needs to only be performed once. Although the system is described with reference to caching transforms it is within the scope to store the transforms in any form of permanent or temporary memory including non-volatile memory.

In an example using the cache method described above with reference to FIG. 2 the following process would be used to transform the coordinates of a physical shape located in M2/B1 into the coordinates system of Top. (1) Assume the origin (i.e. the lower left corner) of the physical shape in M2/B1 is {100, 100} according to the coordinate system of Bot because M2/B1 lies in the instance B1 of the physical layer Bot. (2) The system accesses the stored transform +{200, 200} of B1 that was calculated in a previous operation as described in a previous example and applies the transform to the coordinate of the physical shape resulting in a {300, 300} coordinate of the physical object. This calculation is more efficient than the traditional calculation because instead of performing a recalculation every time, a transform is stored, accessed, and applied to convert coordinates from any physical layer to the coordinate system of the top physical layer.

An evulation system is used whenever a RootHier or one of its antecedents is moved to invalidate the cached transforms and then to recalculate the transforms when they are next needed. This makes the system robust and as efficient as possible at the cost of the memory needed to store the concatenated transforms on each RootHier.

Hierblock Handles

Figure 5:
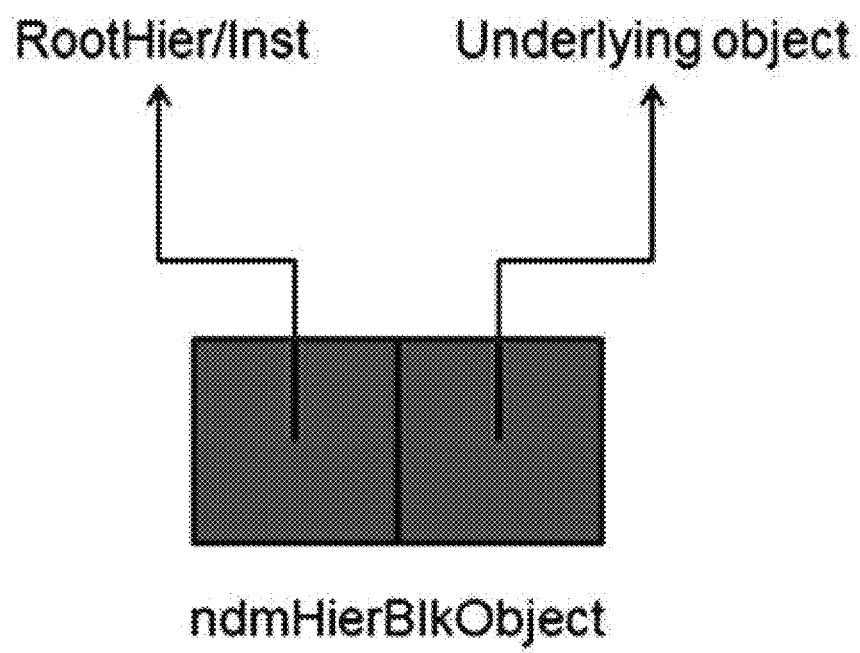
FIG. 5 depicts HierBlock handles in one embodiment.

FIG. 5 depicts HierBlock handle HierBlkObject in one embodiment. A HierBlock handle is comprised of two pointers. The first is a pointer to a context object and the second is to the underlying object. The point to the context object usually points to the RootHier for the level of physical hierarchy in which the underlying physical object is located. For example, with reference to FIG. 2, a shape (i.e. the underlying object) located in M1 would have the RootHier Mid, thus Mid would also serve as the HierBlock handle context object.

For object methods that are non-physical in nature (i.e. logical), the method on the underlying object is used directly. Examples of this sort of method are the name of a BlkInst or the information as to whether or not a given BlkInst has a keepout margin defined.

For object methods that are physical in nature, the cached transform described in the preceding section, stored with the RootHier, is used to transform the physical data taken from the underlying object. For example, for the occurrence of Bot described by the instance path M1/B2, the transform needed to turn coordinates inside M1/B2 into the coordinate system of Top is cached on the RootHier (Bot) for M1/B2. For example, there was a BlkInst called "C1" inside the Bot physical layer. The bounding box for the BlkInst is transformed and returned. This means that retrieving the bounding box for C1 from each of its occurrences M1/B1, M1/B2, M2/B1 and M2/B2 will each return different values based on the different location of each of the instances of Bot.

There are two exceptions to the use of the RootHier as the context object in a HierBlkObject handle. The first is when the RootHier of the underlying object is the HierRoot. Even though the top level is a RootHier, its coordinate system is the coordinate system for HierBlkObjects. In this situation the context pointer is made a NULL pointer. A NULL pointer lets the system know that no transform is required, and it makes HierBlkObject handles for top-level objects that much more efficient.

The second exception to the use of the RootHier as the context object in a HierBlkObject handle occurs when there is a handle to a leaf-cell object (e.g. an AND gate). The interface to leaf-cells is typically folded. This means that a RootHier inside a leaf cell is not unique, as it otherwise would be for physically hierarchical cells. For such HierBlkObject handles, the context pointer is instead the Inst whose reference is the lib-cell (e.g. an AND gate). A low-order bit of the context pointer may be used to indicate whether the pointer refers to a RootHier or to an Inst. For the computations involving a HierBlkObject handle for an object inside a leaf cell, an extra computation is required to concatenate the transform cached on the RootHier of the Inst with the transform of the Inst itself. This makes direct access to physical data within leaf cells be presented in a way that is consistent and simple to use from a user's point of view.

While multiple levels of hierarchy may be viewed together, traditionally only objects in a single physical context are available for interaction at any given time, and the user must use Edit-in-place, descend edit, or similar techniques to navigate between the various physical contexts to interact with the data and modify it. This invention via RootHier caching and/or HierBlkObject handles allows the user to simultaneously select and manipulate objects from multiple physical contexts without needing to change between different physical contexts, and allows for the user to transform them given a single consistent coordinate space, enhancing productivity and ease of use.

Examples of HierBlkObject Handle Usage

This invention extends the collection notion for physical objects, leveraging the HierBlkObject handles to provide access to physical data in a way that is virtually flat. This allows for editing of physical data throughout the different levels of physical hierarchy in a way that is transparent to the user. We call this Transparent Hierarchy Editing.

The following paragraphs describe a series of examples of Transparent Hierarchy Editing that increase in complexity and demonstrate the different features of this style of editing.

Figure 6:
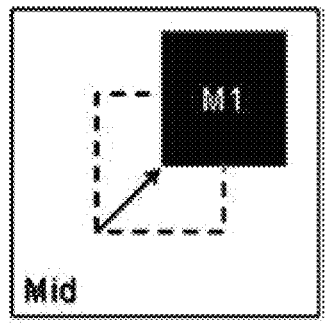
FIG. 6 illustrates a one-level example of an embodiment of the invention.

FIG. 6 illustrates a one-level example of a rectangle M1 within a physical layer block called Mid being moved in one embodiment. In context of the HierBlkObject the underlying object pointer points to M1, and the context object pointer points to the RootHier Mid. Note that Mid would also be the HierRoot as it is the highest physical level. In the user interface, M1 has an initial value of {100, 100, 300, 300}, wherein 100, 100 corresponds to the (X,Y) coordinates of the lower left corner and 300, 300 corresponds with the (X,Y) coordinates of the upper right corner. M1 coordinates are changed from {100 100 300 300} to {200 200 400 400} which moves M1.

Figure 7:
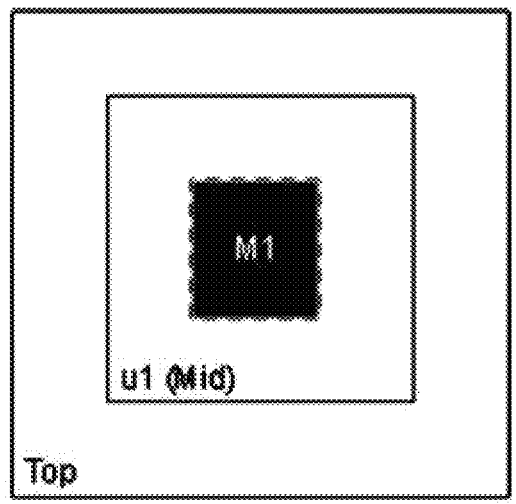
FIG. 7 illustrates a two-level example of an embodiment of the invention.

FIG. 7 illustrates a two-layer example comprising of a Top level and an instance of a Mid level. Rectangle M1 is located within BlkInst (an instance of physical layer Mid) u1 (Mid). In the context of the HierBlkObject the underlying object pointer points to M1 and the context object pointer points to the RootHier in the u1 instance of Mid. The Top level acts as the HierRoot because it is the highest physical level.

Figure 8:
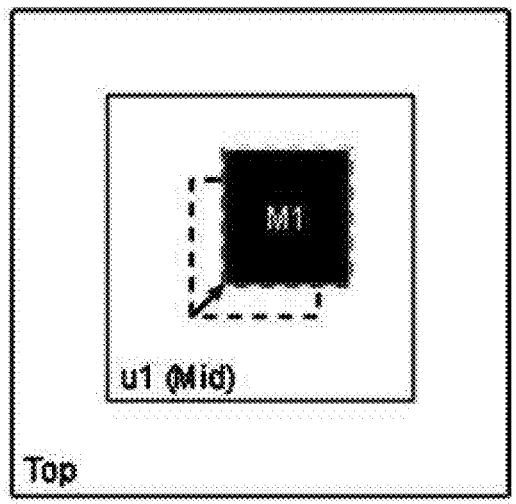
FIG. 8 illustrates another two-level example of an embodiment of the invention.
Figure 9:
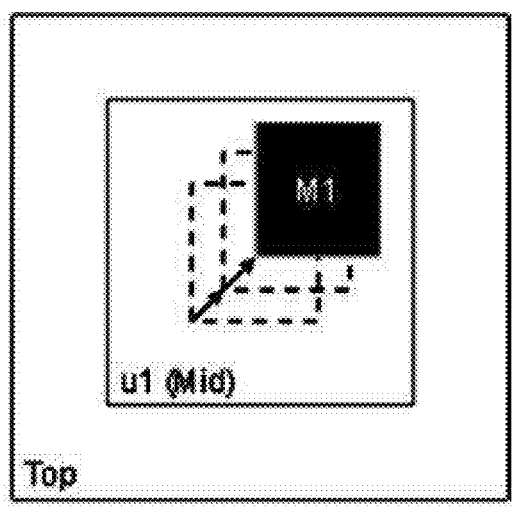
FIG. 9 illustrates another two-level example of an embodiment of the invention.

FIG. 8 illustrates the two-level example of FIG. 7 with movement. M1 is moved but this time in the context of the Top block, not the Mid block as was the case in FIG. 6 The initial coordinates of M1 were {100 100 300 300}, however, since the origin (i.e. the bottom left corner) of the BlkInst u1 (Mid) inside Top is {100 100}, this means the coordinates of M1 from the context of Top is {200 200 400 400}. Changing its coordinates to move it by 50 units in both the X and Y directions results in an coordinates of {250 250 450 450}. Note that there can be two HierBlkObject handles to the same M1, one with a context object of Top and the other with a context object of Mid. The final location of M1 listed directly above corresponds to the values seen in the HierBlkObject handle of Top. The location reported for the same rectangle using the HierBlkObject with the context object of Mid is {150 150 350 350}. This same handle with the context object of Mid can be used to further move the rectangle M1 as seen in FIG. 9. If we set using this handle M1 to {200 200 400 400}, then the value retrieved using the handle with Top as the context object becomes {300 300 500 500}. As can be seen from FIGS. 6-9 the HierBlkObject handle's pointer allows the position of an underlying object to be viewed from different contexts. This allows all underlying objects to be viewed from the same context (i.e. making the design appear flat rather than hierarchical).

Figure 10:
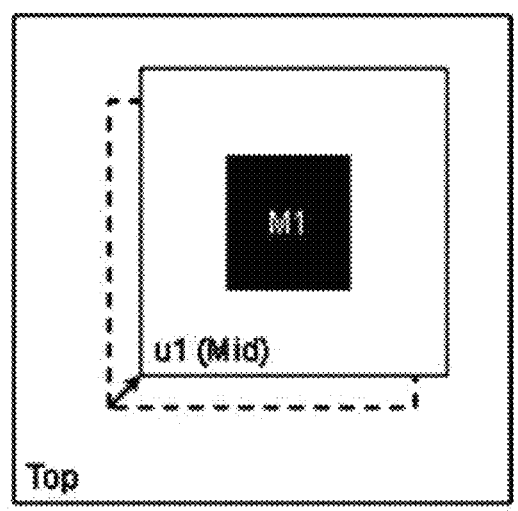
FIG. 10 illustrates another two-level example of an embodiment of the invention.

In certain embodiments, the coordinates of physical objects will also change as the location of the physical instances are changed. FIG. 10 shows the case where the origin of the u1 instance of Mid is moved from {100 100} to {150 150}. This has the effect of moving the coordinates of M1 from {200 200 400 400} to {250 250 450 450} when viewed with Top as the context object of a HierBlkObject handle. Note that in this case the coordinates when viewed with u1 (Mid) as the context object of the HierBlkOject handle M1 is unchanged at {100 100 200 200}, because in relation to M1's initial position from the view of u1 (Mid) there has been no movement.

Figure 11:
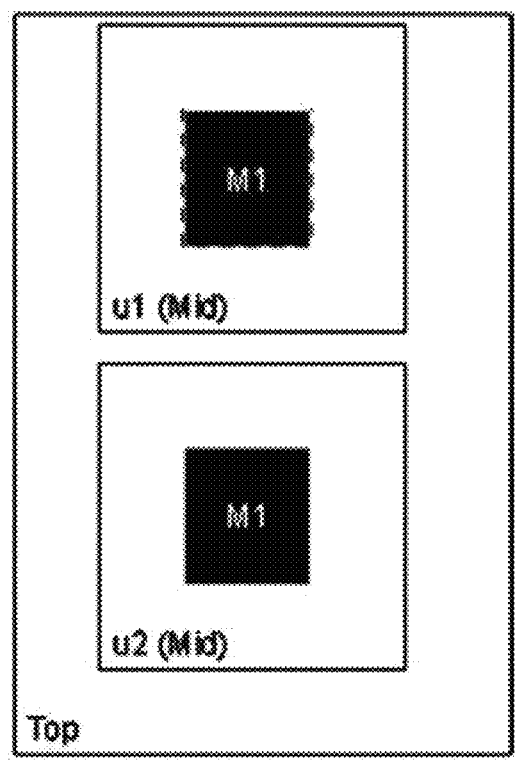
FIG. 11 illustrates another two level example of an embodiment of the invention.
Figure 12:
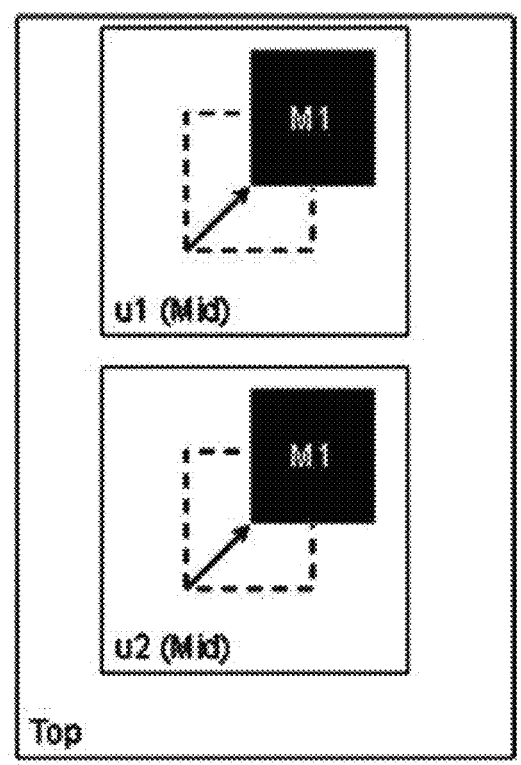
FIG. 12 illustrates another two level example of an embodiment of the invention.

Sub-blocks can be instantiated more than once. In the previous example, another instance of Mid called u2 can be added. FIG. 11 shows this configuration. From u1 the coordinates of M1 are {200 650 400 850}, while from u2 the coordinates of M1 are {200 200 400 400}. If M1 is moved inside Mid, it will move in every instance of Mid (i.e. in both u1 and u2), as shown in FIG. 12. HierBlkObject handles rooted at Top for the two occurrences of M1 will return different results. From u1 the coordinates of M1 are {300 750 500 950}, while from u2 the coordinates of M1 are {300 300 500 500}.

These examples are applicable to hierarchical designs with more than two levels of physical hierarchy. In addition, these examples are meant to be illustrative and do not limit the use or scope of the invention. As for use of the handles in the UI for "transparent hierarchy" editing there are quite a few additional uses of these handles that take advantage of the facility.

Figure 13:
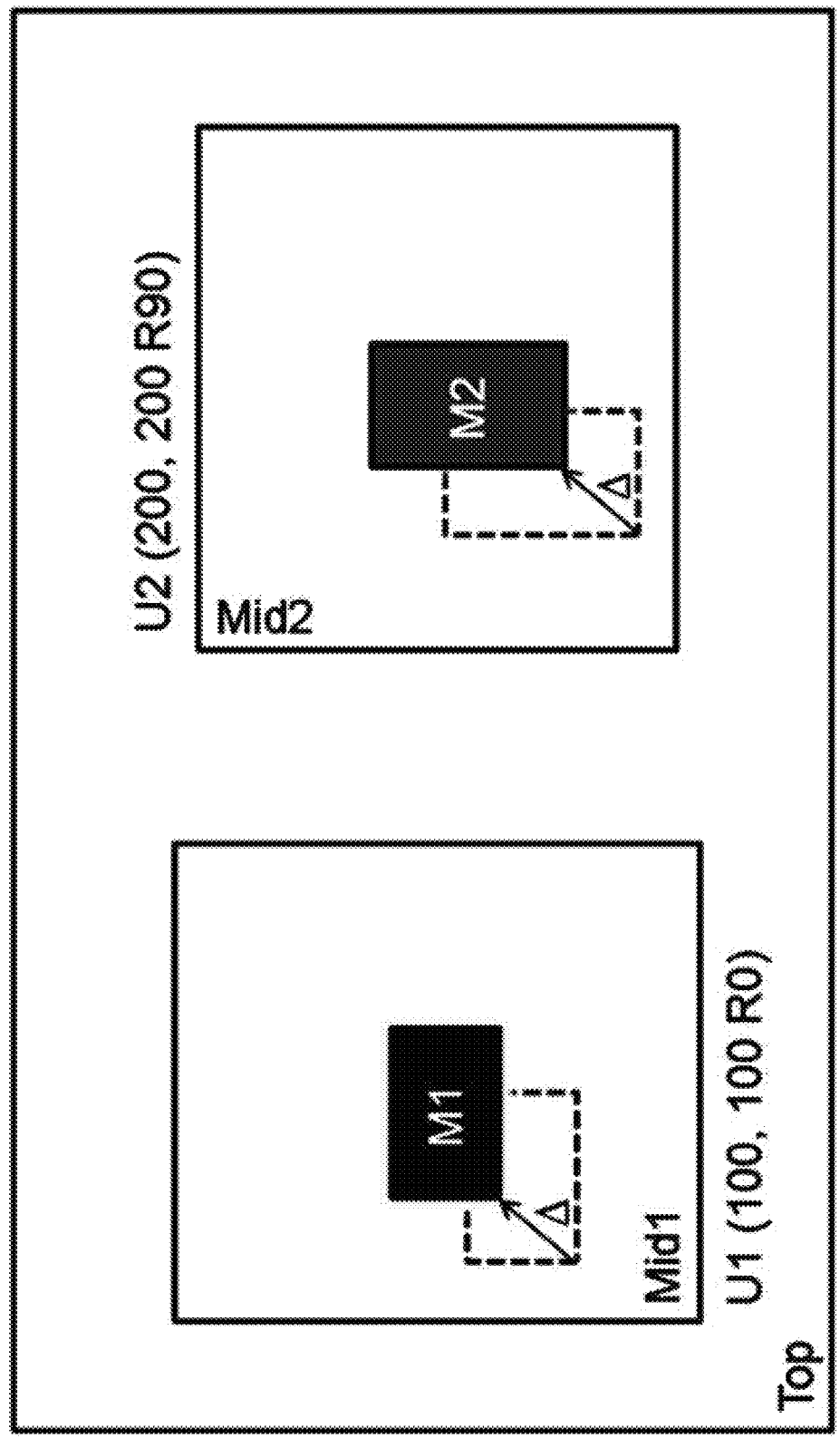
FIG. 13 illustrates another two level example of an embodiment of the invention.

FIG. 13 shows manipulation of multiple physical contexts simultaneously according to one embodiment. In this example, Top contains 2 different cells U1 and U2 which are separate physical hierarchies (Mid1 and Mid2). U1 is placed at the origin {100, 100} and is not rotated (i.e. R0=0), while instance U2 is placed at the origin {200, 200} and is rotated by 90 degrees. Mid1 contains a macro M1, while Mid2 contains a macro M2. A user may desire to move M1 and M2 by a delta so that they remain aligned as they are relative to each other within Top. The user can select M1 and M2 from the Top context and move them by a delta specified in the coordinate system of Top. The proper transformations can then automatically be applied to do the appropriate moves of M1 in Mid1 and M2 in Mid2.

Accordingly, the user has the ability to select and interact with objects in multiple physical contexts from a single shared hierarchical context. The user also has the ability to manipulate those objects using a single transformations specified at the shared physical context and automatically apply them relative to the physical context they are defined in. The contexts may involve multiple levels of transformation, including translation and rotation for each level of hierarchy. A single view can be provided of the data in the top coordinate system and allows the user to interact with it in that context. Changes are properly applied for the folded physical model, doing the necessary transformations under the hood when applying the changes, and then presenting the results to the user in that top level context.

Transparent Hierarchy

Transparent hierarchy is used to implement a variety of additional interactive capabilities across multiple physical blocks all in a single and consistent context. These include query, selection, snapping to objects, and the full variety of physical editing functions (move, stretch, align, rotate, split, cut, add, create, remove, property editing, etc.)

Not only are coordinates transformed for the hierblk handles but also the names of the objects are also extended exposing a full hierarchical instance name for every object by concatenating the full name of the blkInst and the object name for the object within its definition to provide a full hierarchical name for the instance of the object.

The transparent hierarchy greatly reduces or eliminates the need to change physical block contexts when editing hierarchical blocks, allowing all of the operations to be executed from a single context.

Creation of new objects with transparent physical hierarchy uses the context for the related objects to determine in which context the data should be created. For example, when starting a route from a pin in a sub-block the routing is created in the block that contains that pin. In addition, the route creation tool has an option to create the routing in the top block while using all of the leaf pins on the nets across the various hierarchical blocks as the pins to create the physical connections. This allows the user to control which context the data is created in, while still having the full transparent context used when creating the connections.

These handles also enable the creation of routing connections to pins that connect instances within multiple physical contexts as if they were a single net, enabling the routing to be completed before physical pins are added to the hierarchical blocks for the net. This in turn allows that detailed routing to be used to create the pins on the physical hierarchies based on that routing, allowing the top level routing to be used to drive the pin assignments.

Transparency allows the constructions to be generated referencing objects from other contexts in their construction. For example, if the Top has two sub blocks Mid1 and Mid2, a new shape can be constructed in Mid2 that is aligned with an existing shape in Mid1 all from within the Top context. In a folded model with edit-in-place, when the user pushes into a Mid1 to edit it, then the objects in other blocks are not available as active references when in that context.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

Components of the Described Invention

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

Figure 14:
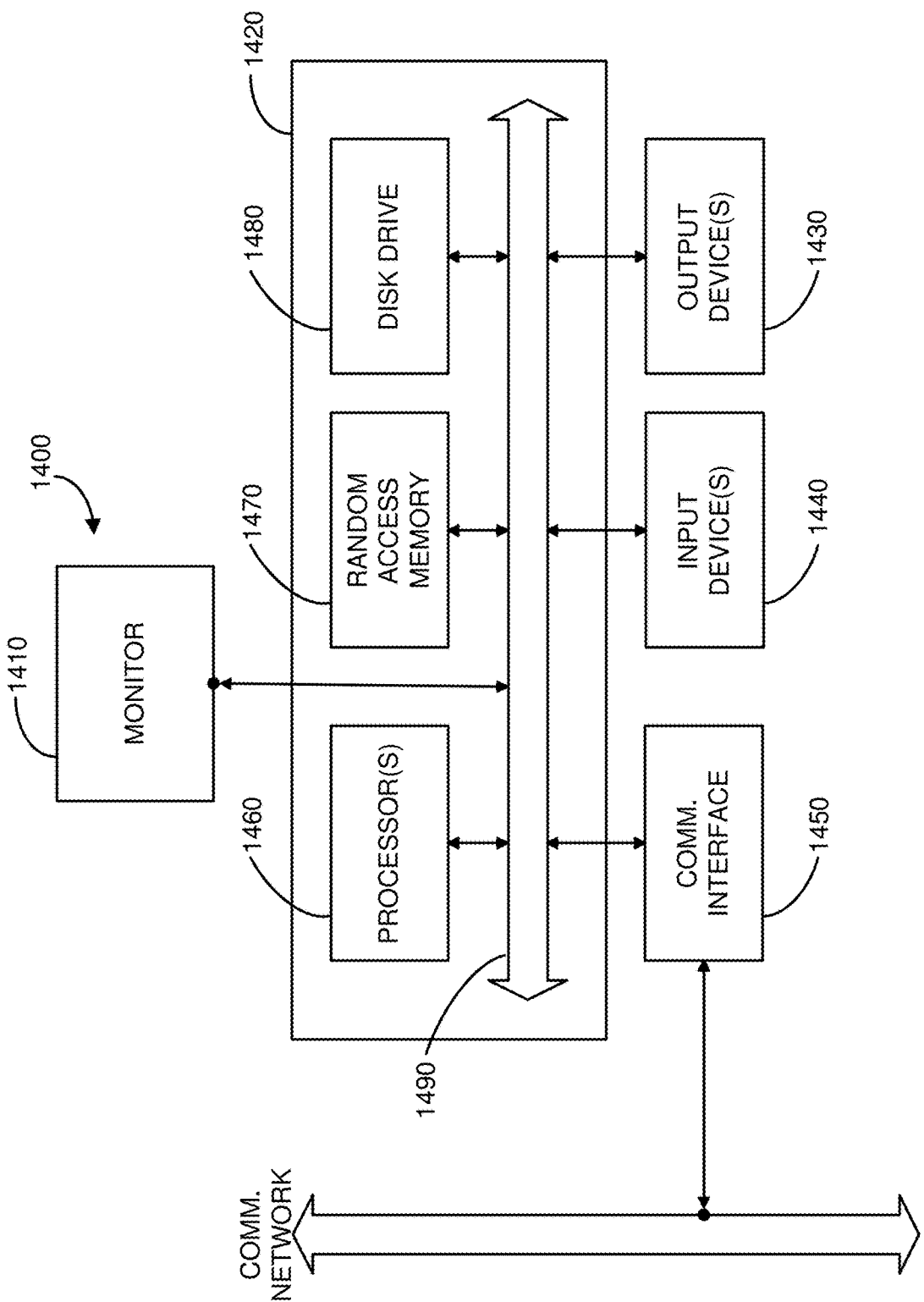
FIG. 14 is a simplified block diagram of a computer system 1400 that may incorporate embodiments of the present invention.

FIG. 14 is a simplified block diagram of a computer system 1400 that may incorporate embodiments of the present invention. FIG. 14 is merely illustrative of an embodiment incorporating the present invention and does not limit the scope of the invention as recited in the claims. One of ordinary skill in the art would recognize other variations, modifications, and alternatives.

In one embodiment, computer system 1400 typically includes a monitor 1410, a computer 1420, user output devices 1430, user input devices 1440, communications interface 1450, and the like.

As shown in FIG. 14, computer 1420 may include a processor(s) 1460 that communicates with a number of peripheral devices via a bus subsystem 1490. These peripheral devices may include user output devices 1430, user input devices 1440, communications interface 1450, and a storage subsystem, such as random access memory (RAM) 1470 and disk drive 1480.

User input devices 1430 include all possible types of devices and mechanisms for inputting information to computer system 1420. These may include a keyboard, a keypad, a touch screen incorporated into the display, audio input devices such as voice recognition systems, microphones, and other types of input devices. In various embodiments, user input devices 1430 are typically embodied as a computer mouse, a trackball, a track pad, a joystick, wireless remote, drawing tablet, voice command system, eye tracking system, and the like. User input devices 1430 typically allow a user to select objects, icons, text and the like that appear on the monitor 1410 via a command such as a click of a button or the like.

User output devices 1440 include all possible types of devices and mechanisms for outputting information from computer 1420. These may include a display (e.g., monitor 1410), non-visual displays such as audio output devices, etc.

Communications interface 1450 provides an interface to other communication networks and devices. Communications interface 1450 may serve as an interface for receiving data from and transmitting data to other systems. Embodiments of communications interface 1450 typically include an Ethernet card, a modem (telephone, satellite, cable, ISDN), (asynchronous) digital subscriber line (DSL) unit, FireWire interface, USB interface, and the like. For example, communications interface 1450 may be coupled to a computer network, to a FireWire bus, or the like. In other embodiments, communications interfaces 1450 may be physically integrated on the motherboard of computer 1420, and may be a software program, such as soft DSL, or the like.

In various embodiments, computer system 1400 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 1420 includes one or more Xeon microprocessors from Intel as processor(s) 1460. Further, one embodiment, computer 1420 includes a UNIX-based operating system.

RAM 1470 and disk drive 1480 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 1470 and disk drive 1480 may be configured to store the basic programming and data constructs that provide the functionality of the present invention.

Software code modules and instructions that provide the functionality of the present invention may be stored in RAM 1470 and disk drive 1480. These software modules may be executed by processor(s) 1460. RAM 1470 and disk drive 1480 may also provide a repository for storing data used in accordance with the present invention.

RAM 1470 and disk drive 1480 may include a number of memories including a main random access memory (RAM) for storage of instructions and data during program execution and a read only memory (ROM) in which fixed instructions are stored. RAM 1470 and disk drive 1480 may include a file storage subsystem providing persistent (non-volatile) storage for program and data files. RAM 1470 and disk drive 1480 may also include removable storage systems, such as removable flash memory.

Bus subsystem 1490 provides a mechanism for letting the various components and subsystems of computer 1420 communicate with each other as intended. Although bus subsystem 1490 is shown schematically as a single bus, alternative embodiments of the bus subsystem may utilize multiple busses.

FIG. 14 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other micro processors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims. In addition, the technique and system of the present invention is suitable for use with a wide variety of EDA tools and methodologies for designing, testing, and/or manufacturing integrated circuits or other electronic devices. The scope of the invention should, therefore, be determined not with reference to the above description, but instead should be determined with reference to the pending claims along with their full scope or equivalents.

Various embodiments of any of one or more inventions whose teachings may be presented within this disclosure can be implemented in the form of logic in software, firmware, hardware, or a combination thereof. The logic may be stored in or on a machine-accessible memory, a machine-readable article, a tangible computer-readable medium, a computer-readable storage medium, or other computer/machine-readable media as a set of instructions adapted to direct a central processing unit (CPU or processor) of a logic machine to perform a set of steps that may be disclosed in various embodiments of an invention presented within this disclosure. The logic may form part of a software program or computer program product as code modules become operational with a processor of a computer system or an information-processing device when executed to perform a method or process in various embodiments of an invention presented within this disclosure. Based on this disclosure and the teachings provided herein, a person of ordinary skill in the art will appreciate other ways, variations, modifications, alternatives, and/or methods for implementing in software, firmware, hardware, or combinations thereof any of the disclosed operations or functionalities of various embodiments of one or more of the presented inventions.

The disclosed examples, implementations, and various embodiments of any one of those inventions whose teachings may be presented within this disclosure are merely illustrative to convey with reasonable clarity to those skilled in the art the teachings of this disclosure. As these implementations and embodiments may be described with reference to exemplary illustrations or specific figures, various modifications or adaptations of the methods and/or specific structures described can become apparent to those skilled in the art. All such modifications, adaptations, or variations that rely upon this disclosure and these teachings found herein, and through which the teachings have advanced the art, are to be considered within the scope of the one or more inventions whose teachings may be presented within this disclosure. Hence, the present descriptions and drawings should not be considered in a limiting sense, as it is understood that an invention presented within a disclosure is in no way limited to those embodiments specifically illustrated.

Accordingly, the above description and any accompanying drawings, illustrations, and figures are intended to be illustrative but not restrictive. The scope of any invention presented within this disclosure should, therefore, be determined not with simple reference to the above description and those embodiments shown in the figures, but instead should be determined with reference to the pending claims along with their full scope or equivalents.

What is claimed is:

1. A computer implemented method for hierarchical editing of a physical layout representation of an integrated circuit while transforming a netlist representation of the integrated circuit to the physical layout of the integrated circuit, the method comprising:
   creating, by the computer, a handle to a first physical shape disposed in a first level of hierarchy of the layout representation, wherein the first physical shape has a first set of coordinates in a first coordinate system associated with the first level of hierarchy;
   determining a transform value defining the location of the first physical shape with respect to a second coordinate system associated with a second level of hierarchy;
   storing the transform value via the handle in a memory disposed in the computer system;
   determining a second set of coordinates of the first physical shape in the second coordinate system in accordance with the transform value, and
   using the handle to provide an interface to the first physical shape so as to make the first physical shape appear as being in the second level of hierarchy.

2. The method of claim 1, further comprising modifying the first physical shape using the second set of coordinates.

3. The method of claim 1, further comprising applying the transform value to the first set of coordinates to determine the second set of coordinates.

4. The method of claim 1, wherein the first and second coordinate systems are Cartesian coordinate systems.

5. The method of claim 1, wherein the second level of hierarchy comprises the top level of hierarchy.

6. The method of claim 1, wherein the handle comprises a first pointer and a second pointer, wherein the first pointer references the first set of coordinates.

7. The method of claim 5, wherein the second pointer references the first level of hierarchy except:
   in circumstances where the first level of hierarchy is the second level of hierarchy; and
   in circumstances where the physical shape is in a leaf-cell object.

8. A layout editor adapted to transform a netlist representation of the integrated circuit to a physical layout of the integrated circuit, the layout editor configured to:
   create, via the computer, a handle to a first physical shape disposed in a first level of hierarchy of a layout representation of the integrated circuit, wherein the physical shape has a first set of coordinates in a first coordinate system associated with the first level of hierarchy;
   determine a transform value defining the location of the first physical shape with respect to a second coordinate system associated with a second level of hierarchy;
   store the transform value via the handle in a memory disposed in the computer system; and
   determine a second set of coordinates of the first physical shape in the second coordinate system in accordance with the transform value, and
   use the handle to provide an interface to the first physical shape so as to make the first physical shape appear as being in the second level of hierarchy.

9. The layout editor of claim 8, further configured to modify the first physical shape using the second set of coordinates.

10. The layout editor of claim 8, further configured to apply the transform value to the first set of coordinates to determine the second set of coordinates.

11. The layout editor of claim 8, wherein the first and second coordinate systems are Cartesian coordinate systems.

12. The layout editor of claim 8, wherein the second level of hierarchy comprises the top level of hierarchy.

13. The layout editor of claim 8, wherein the handle comprises a first pointer and a second pointer, wherein the first pointer references the first set of coordinates.

14. The layout editor of 13, wherein the second pointer references the first level of hierarchy except;

in circumstances where the first level of hierarchy is the second level of hierarchy; and in circumstances where the physical shape is in a leaf-cell object.

\* \* \* \* \*